United States Patent [19]

Gudorf

[11] 4,213,238
[45] Jul. 22, 1980

[54] METHOD OF FORMING A LEAD TO AN ELECTRODE ON A CHARGE PLATE

[75] Inventor: James L. Gudorf, Dayton, Ohio

[73] Assignee: The Mead Corporation, Dayton, Ohio

[21] Appl. No.: 15,198

[22] Filed: Feb. 26, 1979

Related U.S. Application Data

[63] Continuation-in-part of Ser. No. 912,495, Jun. 5, 1978.

[51] Int. Cl.² .............................................. H05K 3/00
[52] U.S. Cl. ..................................... 29/878; 156/230; 249/60; 249/83; 249/114 R; 264/134; 264/225
[58] Field of Search ......................... 29/624, 626, 625; 346/75; 156/230, 231, 232, 237; 264/219, 225, 226, 134, 135, 227; 249/60, 83, 119

[56] References Cited

U.S. PATENT DOCUMENTS

| | | | |
|---|---|---|---|
| 2,781,549 | 2/1957 | Milne | 29/626 X |
| 3,552,004 | 1/1971 | Hagelbarger et al. | 29/625 |
| 3,586,909 | 6/1971 | Beam et al. | 346/75 X |
| 3,604,980 | 9/1971 | Robertson | 346/75 X |
| 3,618,858 | 11/1971 | Culp | 346/75 X |
| 3,687,413 | 8/1972 | Murfitt et al. | 264/225 X |
| 3,984,843 | 10/1976 | Kuhn | 346/75 |
| 4,047,184 | 9/1977 | Bassous et al. | 346/75 |

OTHER PUBLICATIONS

IBM Tech. Discl. Bull., vol. 19, No. 4, pp. 1471-1472.
IBM Tech. Discl. Bull., vol. 17, No. 6. pp. 1803-1804.

Primary Examiner—Carl E. Hall
Assistant Examiner—C. J. Arbes
Attorney, Agent, or Firm—Biebel, French & Nauman

[57] ABSTRACT

Connection of electrical leads to individual charge electrodes in a charge plate structure is facilitated by the integral formation of such leads during the mold stage of formation of a charge plate. An elastomeric mold is formed from a charge plate master coated with a photoresist material and having base area corresponding to the placement of the electrical leads. The elastomeric mold is coated with an electrically conductive resin, and a charge plate is cast in the mold. Upon separation, the conductive resin transfers to the charge plate structure forming charge electrodes. Lapping or grinding the surface of the structure removes excess resin and leaves the electrical leads intact.

9 Claims, 8 Drawing Figures

METHOD OF FORMING A LEAD TO AN ELECTRODE ON A CHARGE PLATE

CROSS REFERENCE TO RELATED APPLICATION

This application is a continuation-in-part of application Ser. No. 912,495 filed June 5, 1978, entitled Charge Plate and Method of Manufacture. Reference is also made to application Ser. No. 950,623 filed Oct. 12, 1978, entitled Charge Plate with Conductive Pads and Method of Manufacture, also a continuation-in-part of application Ser. No. 912,495.

BACKGROUND OF THE INVENTION

This invention relates to charge plates for use in a laminated coating head of the general type described in Beam et al. U.S. Pat. No. 3,586,907, and more particularly to an improved method of connecting electrical leads to charge electrodes in such charge plates.

As explained in copending application Ser. No. 912,495, coating heads of the type described by Beam et al. are used in ink jet printing systems, which create printed matter by selective charging, deflecting, and catching of drops produced by one or more rows of continuously flowing ink jets. The jets themselves are produced by forcing ink under pressure through a series of orifices in an orifice plate, which is one component of the laminated head.

A stimulation arrangement stimulates the jets to break the ink up into uniformly sized and regularly spaced drops, with drop formation occurring in all jets at more or less fixed positions, all located approximately the same distance from the orifice plate. The charge plate is positioned within the coating head so that electrical charging of selected ones of the drops being generated is achieved.

A charge plate of the type used by the Beam et al. patent utilizes a plate of dielectric material provided with a series of charging tunnels located equidistantly along a straight line. Each charging tunnel is coated with an electrically conductive material which defines a cylindrical charging electrode. Electrical leads must be connected to each such charge electrode, and the electrical leads in turn are selectively activated by an appropriate data processing system.

Typical prior art charge plates including such electrodes are disclosed in Solyst, U.S. Pat. No. 3,975,741, in Kuhn, U.S. Pat. No. 3,984,843, and in Bassous et al., U.S. Pat. No. 4,047,184. The prior art also includes charge plates having charging electrodes formed in notches along the edges of the plate, as disclosed in the above mentioned Solyst patent, and also in Robertson, U.S. Pat. No. 3,604,980, Culp, U.S. Pat. No. 3,618,858, and in Van Breemen et al., U.S. Pat. No. 4,035,812.

In addition to the difficulties arising in the fabrication of charge plates, described in detail in copending application Ser. No. 912,495, difficulties have also arisen in reliably and rapidly connecting electrical leads to each individual charge electrode on the charge plate. Previous methods for connecting the electrical leads to each charge electrode used laborious and slow hand painting, with conductive paint, of a connecting line between each lead and charge electrode. The difficulty of such an operation will be appreciated when it is remembered that the center-to-center spacing of each charge electrode is only about 0.423 mm and each charge electrode has an internal diameter of only about 0.355 mm, leaving a spacing between charge electrodes of only about 0.068 mm. Depending upon the size of the charge plate and the area to be printed, anywhere from several hundred to over one thousand connections per charge plate must be made. The previous methods suffered not only from the length of time required to complete the operation, but also from globbing of the conductive paint over into charge electrode tunnels and partially blocking them and irregularities in the conductive connecting lines being painted. This resulted in either a poor or no connection on the one hand to two or more connections flowing into one another on the other.

Accordingly, the need exists in the art for a rapid and reliable method for connecting electrical leads to charge electrodes on a charge plate.

SUMMARY OF THE INVENTION

In accordance with this invention, an improved, durable, and dimensionally stable charge plate is provided having electrically conductive leads integrally cast therewith. The charge plate comprises a plastic support structure cast in place within an elongated slot extending medially along a rigid supporting structure.

The plastic support structure containing the charge tunnels and electrically conductive leads is produced from an elastomeric mold. A master plate having a multiplicity of orifices drilled through it in a desired pattern is coated with a photoresist material. Then, using conventional photofabrication techniques, the photoresist material is removed from the immediate area around each orifice and along a line extending from each orifice where an electrical lead is to be formed. This coated master is then used to make an elastomeric mold having upstanding pins corresponding to the orifices in the master, with outwardly extending ribs from each pin corresponding to the placement of the electrical leads.

This elastomeric mold is then used to form the plastic support structure by placing a support plate over the mold with the medially extending slot in the plate surrounding the mold pins and ribs. In a preferred embodiment, the elastomeric mold, including pins and ribs, is sprayed with a mold release material and then oversprayed with an electrically conductive epoxy paint. A casting resin is poured into the slot until it covers the pins, is cured, and the elastomeric mold then removed. Upon removal, the electrically conductive epoxy transfers to the newly cast structure defining a series of electrically conductive charge electrodes, each having an electrically conductive lead extending therefrom. Lapping or grinding of the surface of the structure removes excess conductive epoxy and leaves the electrical leads intact.

The rigid support plate provides durability and stabilizes the somewhat more flexible plastic support structure. It may be merely a blank plate of a non-conductive material or may have printed circuitry thereon. In a preferred embodiment, the support plate has elecrtrically conductive printed circuit lines extending outwardly from the medially extending slot in the plate to its outer edges. These printed circuit lines correspond directly to the conductive leads in the plastic support structure and are aligned therewith. They may be electrically connected using a hand soldering process or any suitable automated technique.

Accordingly, it is a primary object of this invention to produce repeatedly a dimensionally stable and accurate charge plate structure having electrically conductive leads from each individual charge electrode cast integrally into the structure during the formation step. This and other objects and advantages of the invention will be apparent from the following description, accompanying drawings, and the appended claims.

DESCRIPTION OF THE PREFERRED EMBODIMENTS

Figure 1:
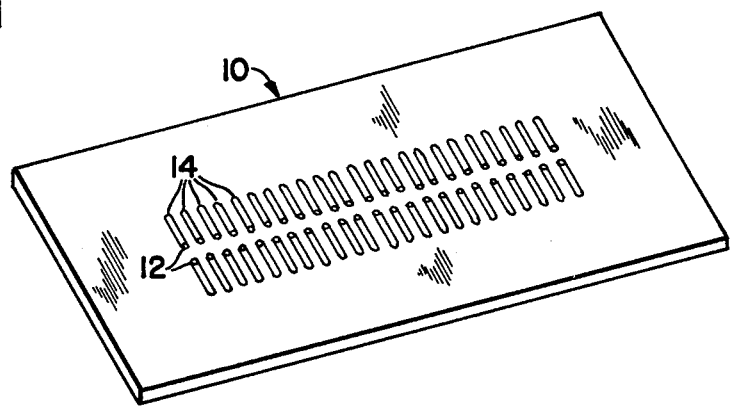
FIG. 1 is a perspective view of a charge plate member masked with photoresist material.
Figure 2:
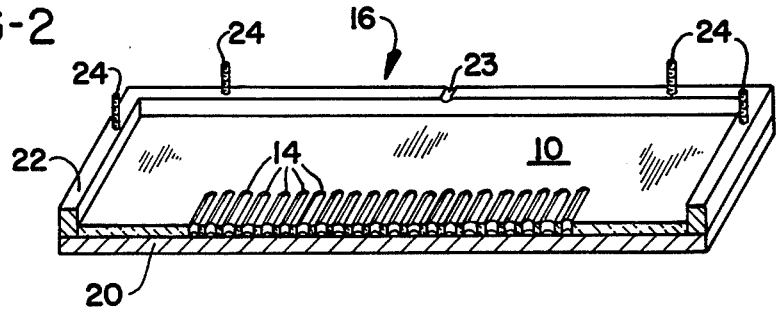
FIG. 2 is a cut away view of a mold fixture and bottom cover with a charge plate master in place.

The preferred method for producing charge plates in accordance with this invention is illustrated in FIGS. 1-8. As shown in FIG. 1 a charge plate master 10 is fabricated which has a series of regularly spaced orifices 12. The orifices may be produced by any conventional process, such as by drilling or etching, which will yield the configuration and positioning required for the charging electrodes of the finished product. The orifices of such a charge plate will have a generally "hour glass" cross section as illustrated in the drawings.

The face of the completed master is then coated with a photoresist material such as Riston photoresist available from Kodak Corp., Rochester, N.Y. The photoresist material is exposed to light in a conventional manner through a positive working mask which has open areas corresponding to a generally circular band around each orifice and a thin line extending outwardly from each orifice. The photoresist material is then developed and removed from the exposed areas. As can be seen in FIG. 1, this results in a series of bare areas 14 extending outwardly from each individual orifice. These bare areas correspond to the place where an electrical lead will be laid down at a later step in the process. Depending on the final charge plate structure desired, these bare areas may extend for only a few millimeters or they may extend outwardly to points corresponding to the edge of a medially extending slot in a support plate as will be explained below.

Once the master with photoresist coating has been completed, it is positioned within a mold fixture 16 having a top plate 18 (shown in FIG. 3), bottom plate 20 and frame 22. The top and bottom plates are held on the frame 22 by means of bolts 24 secured by wing nuts 26 located at suitable positions around the frame. Alternatively, any conventional means for clamping the master 10 in place in the mold fixture may be utilized. After the master 10 is in place and with top plate 18 removed, a suitable liquid elastomeric material is poured into mold fixture 16, completely covering master 10 and filling orifices 12. A suitable elastomer for use in this invention is a silicone rubber compound sold as Silastic brand J RTV elastomer from Dow Corning Corp. of Midland, Mich. This elastomer has an elongation capability of 100 percent after curing, a desirable property for the elastomer mold used in this invention. Prior to pouring, the elastomeric liquid is placed in a vacuum chamber to remove all air bubbles. This procedure is repeated after the liquid elastomer has been poured into place in the mold fixture to insure complete filling of all of the orifices 12 in master 10. After the second evacuation, top plate 18 is put on frame 22 and tightened down by wing nuts 26. A notch 23 is provided in frame 22 for overflow of excess molding compound. The mold fixture is then turned upside down, and the elastomer is allowed to cure at room temperature.

Figure 3:
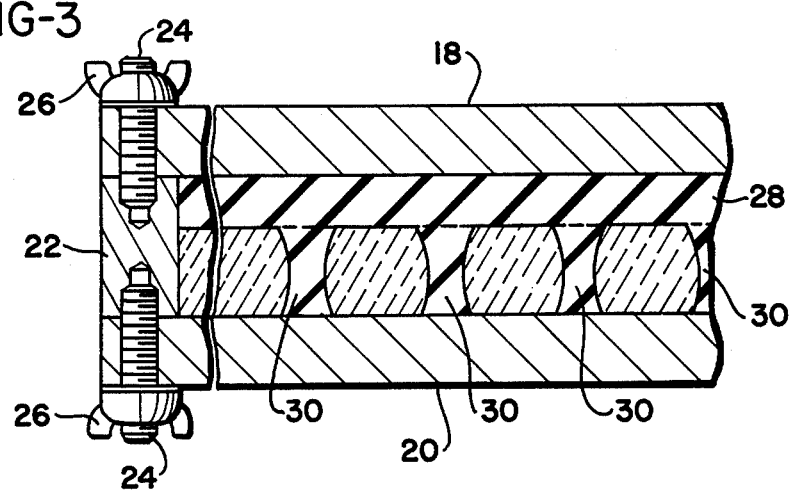
FIG. 3 is a sectional view of an elastomer mold in place against a charge plate master.

As shown in FIG. 3, elastomeric mold 28 includes a series of pins 30 which will assume the hour glass configuration of orifices 12. Elastomer mold 28 is separated from master 10 by removing plate 20, now on the top of the mold fixture, and gently prying the master out of the mold cavity. Because of the great flexibility of the mold 28 and pins 30, this can be accomplished quite easily. Additionally, a mold release agent may be sprayed onto the surface of the master prior to the pouring of the liquid elastomer to facilitate its later removal.

After trimming away any excess elastomer in the mold fixture, the mold 28, including pins 30 and ribs 32, is sprayed with a suitable mold release agent such as Miller Stephanson MS-122 sold by the Miller Stephanson Chemical Company of Danbury, Conn. The mold is then oversprayed with a suitable electrically conductive epoxy resin paint such as ECR 4100 silver epoxy sold by Formulated Resins, Inc. of Greenville, R.I. to form a coating 34. The epoxy mixture may be thinned with toluol for easy spraying. Preferably, elastomer mold 28 is masked around the areas of pins 30 and ribs 32 during the spraying step so that the coating 34 has a generally rectangular outline as best illustrated in FIG. 4.

Figure 4:
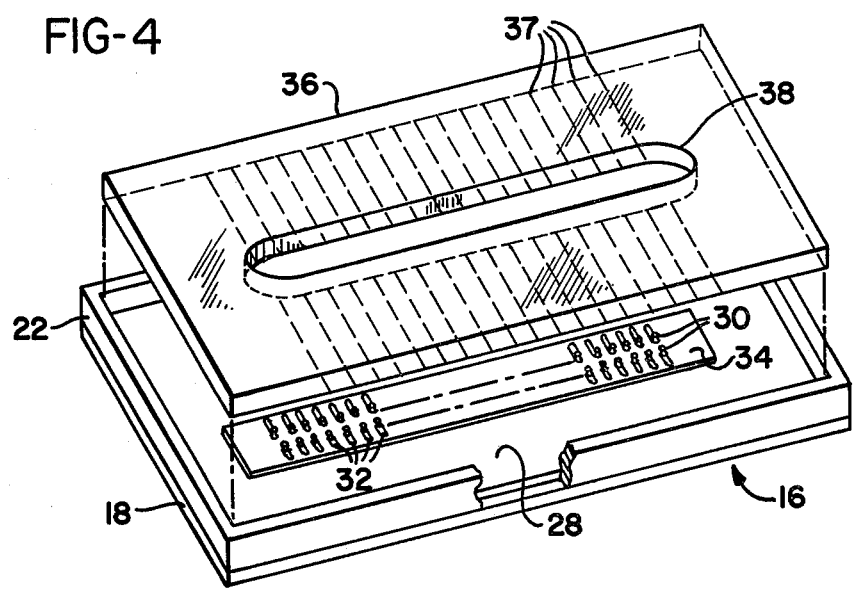
FIG. 4 illustrates the alignment and positioning of a support plate in a mold fixture.

As shown in FIG. 4, support plate 36 is now positioned against elastomer mold 28 in mold fixture 16. Support plate 36 is made from a rigid, durable material such as fiberglass board known in the art as G-10 board. Support plate 36 has a medially extending slot 38 through which pins 30 and ribs 32 extend. In a preferred embodiment, support plate 36 will have pre-printed electrical leads 37 on one face thereof. That face is placed down against mold 28, and the preprinted leads are aligned with ribs 32. The face of support plate 36 may be coated with a protective coating which is of the same thickness as the vertical thickness of ribs 32. In this manner, the preprinted leads on the face of the support plate will directly line up and connect with conductive epoxy coating 34.

Figure 5:
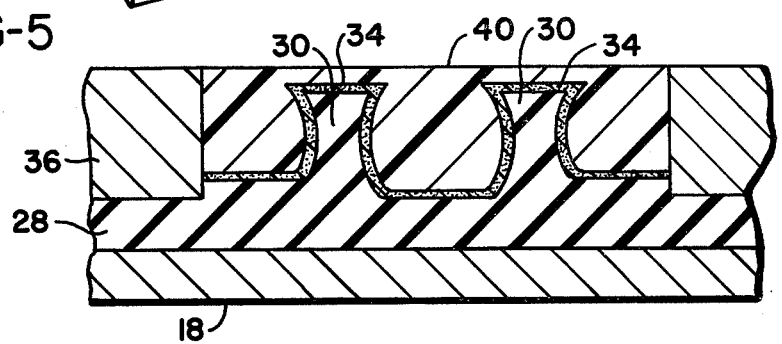
FIG. 5 is an enlarged cross-sectional view of a cored electrode support structure in place against a mold.

After support plate 36 has been properly positioned in mold fixture 16, it is clamped in place by suitable means (not shown). Thereafter, slot 38 is filled with a suitable casting resin. The resin should have a relatively low viscosity and exhibit little shrinkage upon curing. One such resin which has been found to be suitable is an epoxy resin made from a combination of Bisphenol A and epichlorophydrin, sold by Emerson and Cuming, Inc. of Northbrook, Ill., under the name STYCAST 2057. This resin is mixed in a ratio of about 100 parts resin to 7 parts of a modified aliphatic amine catalyst identified by Emerson and Cuming, Inc. as Catalyst 9. Prior to the casting step, the resin and catalyst mixture is placed in a vacuum chamber for evacuation of all air. After casting, the resin is partially cured at room temperature (72° F.) for about 10 hours. An enlarged cross-sectional view of the product after partial curing is illustrated in FIG. 5, with the cast resin being indicated at 40.

Figure 6:
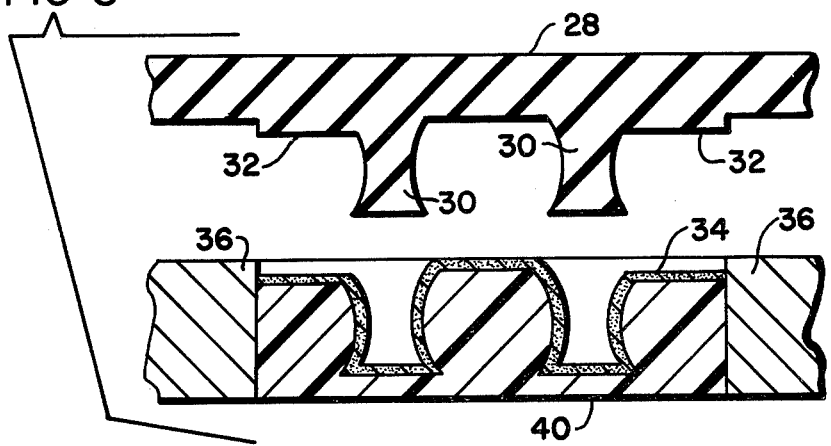
FIG. 6 illustates the step of separating a mold from a charge plate structure.

At this stage, the resin has hardened enough to be separated from the mold. After removal from the mold fixture 16, the charge plate structure is separated from elastomeric mold 28 as shown in FIG. 6. This separation is facilitated by the flexibility of elastomer mold 28 and by the tendency of the silicone elastomer to have little adherence to the materials making up the charge plate structure. Coating the mold with a mold release agent as described above also facilitates separation. At the time of separation, the conductive epoxy coating 34 transfers from elastomer mold 28 to the charge plate structure as shown in FIG. 6.

Figure 7:
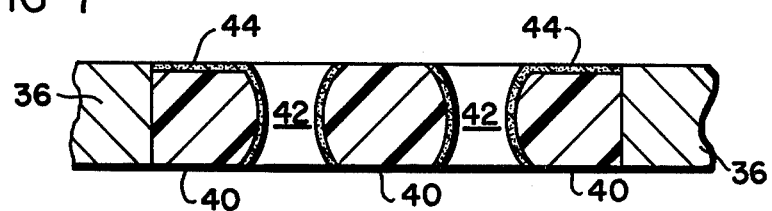
FIG. 7 is an enlarged cross-sectional view of a charge plate structure after finishing on both sides.
Figure 8:
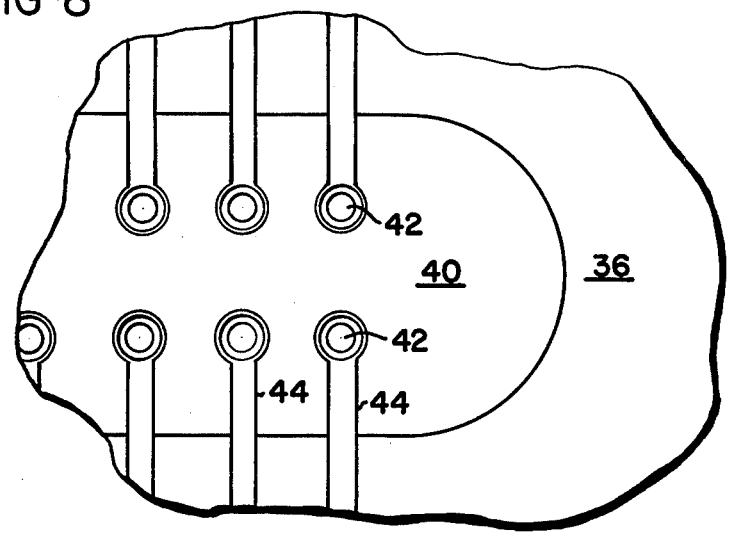
FIG. 8 is an enlarged view of a portion of a fully assembled charge plate.

The charge plate structure is then placed in an oven at 120° to 140° F. for 2 to 4 hours to cure the resin fully. If cured at this temperature, the charge plate structure will not change dimensions. After being fully cured, the charge plate is lapped or ground on both sides as shown in FIG. 7 to produce a finished structure. As can be seen, electrodes 42 comprise the remains of the conductive coating layer 34 after the lapping step. The ribs on the elastomer mold produce depressed areas on the charge plate structure. After lapping, the conductive coating deposited into those areas remains to form leads 44 extending from electrodes 42 as shown in FIG. 8. These leads 44 are in alignment with the preprinted electrically conductive leads on support plate 36 and, after a soldering step to connect them, provide an electrical circuit to the edge of the charge plate structure. These leads may then be connected to plug-in receptacles at the edge of the charge plate as taught in U.S. Pat. No. 4,119,973 to connect electrically each charge electrtrode with a control circuit in an ink jet printing device.

This method of manufacturing a charge plate provides a durable and dimensionally stable structure which can be accurately reproduced. It also eliminates the need for time consuming hand connection of electrical leads at each charge electrode since the support plate used in the process of this invention can have preprinted circuitry which can be aligned in the mold to connect with the lead lines integrally formed in the charge plate during casting. The electrical connection can easily be made at the edge of the cast resin by conventional soldering techniques.

While the methods and apparatus described herein constitute preferred embodiments of the invention, it is to be understood that the invention is not limited to these precise methods and apparatus, and that changes may be made therein in either without departing from the scope of the invention, which is defined in the appended claims.

I claim:

1. A method of producing a charge plate for an ink jet printer comprising the steps of:
   (a) fabricating a master plate including a series of regularly spaced orifices,
   (b) coating a side of said master plate with photoresist material, exposing the photoresist material through a positive working mask containing open areas corresponding to the areas immediately adjacent said orifices and lines extending from each individual orifice, developing the photoresist material, and removing that portion of the material from the exposed areas,
   (c) casting, in a mold fixture, an elastomeric molding material against said master plate and into said orifices, thereby producing an elastomeric mold comprising a base, a series of pins projecting outwardly from said base, and a series of ribs extending outwardly from each of said pins,
   (d) separating said master from said elastomeric mold while maintaining said elastomeric mold in said mold fixture,
   (e) producing a series of electrodes and leads by coating said pins and ribs with a transferrable coating of electrically conductive material,
   (f) fabricating a rigid and durable support plate structure having a medially extending elongated slot,
   (g) placing said support plate against said elastomeric mold with said slot surrounding said pins,
   (h) casting into said slot and against said elastomeric mold and said coated pins and ribs an electrically nonconductive polymeric casting material of a type which is curably adherent to aid support plate and said electrodes and leads,
   (i) curing said polymeric casting material to define a charge plate structure having a series of regularly spaced charge electrodes and leads,
   (j) separating said charge plate structure from said elastomeric mold, and
   (k) removing excess material from the surfaces of said charge plate structure.

2. The method of claim 1 where said elastomeric molding material is a silicone rubber.

3. The method of claim 2 where each of said ribs extends to the edge of the elongated slot in the support plate structure when said structure is placed against said elastomeric mold.

4. The method of claim 3 where said support plate structure has a series of regularly spaced electrically conductive lines imprinted on its surface and said lines are aligned with said ribs when said support plate structure is placed against said elastomeric mold.

5. The method of claim 4 where said mold fixture has removable top and bottom plates and is rotated 180° between the steps of casting the elastomeric mold and separating said master from said elastomeric mold.

6. The method of claim 5 where said electrically conductive material is an electrically conductive epoxy paint.

7. The method of claim 6 including the step of coating said pins and ribs with a mold release agent prior to the production of said electrodes and leads.

8. The method of claim 7 including the step of evacuating said polymeric casting material in a vacuum chamber prior to casting against said elastomeric mold.

9. The method of claim 8 where step (k) includes lapping the front face of the charge plate structure to remove excess electrically conductive material.

* * * * *